United States Patent [19]

Yamamoto et al.

[11] Patent Number: 4,800,836

[45] Date of Patent: Jan. 31, 1989

[54] RESIST COATING APPARATUS

[75] Inventors: Noboru Yamamoto, Yokohama; Yasuo Matsuoka, Kawasaki, both of Japan

[73] Assignee: Kabushiki Kaisha Toshiba, Kawasaki, Japan

[21] Appl. No.: 172,497

[22] Filed: Mar. 24, 1988

[30] Foreign Application Priority Data

Mar. 27, 1987 [JP] Japan .................................. 62-73465

[51] Int. Cl.$^4$ ....................... B05C 13/00; B05C 15/00
[52] U.S. Cl. ......................................... 118/52; 118/320
[58] Field of Search ................... 118/52, 54, 320, 326, 118/56; 427/240

[56] References Cited

U.S. PATENT DOCUMENTS 4,510,176 4/1985 Cuthbert et al. .................. 118/52 X

FOREIGN PATENT DOCUMENTS 59-50525 3/1984 Japan .
59-141220 8/1984 Japan .

Primary Examiner—John McIntosh
Attorney, Agent, or Firm—Foley & Lardner, Schwartz, Jeffery, Schwaab, Mack, Blumenthal & Evans

[57] ABSTRACT

A liquid state resist is dropped to form a coating on a semiconductor substrate mounted on a rotary chuck disposed in a resist coating vessel in which a sealed solvent vapor atmosphere is created. An adjusting plate is provided in the coating vessel above the rotary chuck in a stationary or movable manner to weaken or substantially reduce a swirly flow of the solvent vapor which tends to occur in the coating vessel when the chuck is rotated. Thus a substrate coated with a resist film of uniform thickness is obtained.

10 Claims, 4 Drawing Sheets

RESIST COATING APPARATUS

BACKGROUND OF THE INVENTION

This invention relates generally to resist processing apparatuses and more particularly to a resist coating apparatus for applying a resist on a semiconductor substrate in a solvent atmosphere.

In semiconductor device manufacturing processes, various kinds of patterning are carried out by using photoresists, electron beam resists, etc. (hereinafter called merely resists or resist) by an exposing, a developing or an etching method. It is required for such a manufacturing process to coat evenly the resist on the substrate, and therefore, various kinds of resist coating apparatus for achieving even coating of the resist have been proposed.

One typical example of conventional apparatus provides a resist coating apparatus in which a liquid state resist is dropped on the central portion of the substrate in the solvent atmosphere. Then the substrate is rotated so that the resist is evenly spread on the entire surface of the substrate by the centrifugal force of the rotating substrate.

With the conventional resist coating apparatus of the described type, however, a vortex or swirly flow of solvent vapor occur in the coating vessel which swirly flow adversely causes vapor pressure difference in the coating vessel, resulting in uneven drying speed of the resist on the substrate. This causes unevenness of the viscosity of the resist and finally unevenness of the thickness of the resist film coated on the surface of the substrate.

The unevenness of the thickness of the coated resist film adversely affects the improvement of the quality and the yield of the substrate because the dimension or size of the pattern formed on the substrate changes in accordance with the thickness of the coated resist film.

SUMMARY OF THE INVENTION

An object of this invention is to substantially eliminate difficulties and drawbacks as described which are encountered with a prior art technique and to provide a resist coating apparatus capable of applying a coat of a resist film of even thickness on the entire surface of a substrate in a solvent vapor atmosphere.

Another object of this invention is to provide a resist coating apparatus provided with a member for reducing or eliminating swirly flow of the solvent vapor in a sealed coating vessel to apply a coat of a resist film of even thickness on the entire surface of a semiconductor substrate, thus improving the quality and the yield of the same.

These and other objects can be achieved according to this invention by providing an apparatus for coating resist on a substrate, which apparatus comprises a vessel with an open top covered by a cover plate, a sealing member for creating a sealed solvent vapor atmosphere in the vessel, a circular rotary chuck on which the substrate is mounted and which is disposed in the vessel at substantially the central portion of the vessel to be rotatable through a rotating shaft extending upward through the bottom of the vessel and operatively connected to an external driving source, a nozzle member disposed directly above the central portion of the substrate on the rotary chuck and adapted to drop liquid state resist thereon, and a baffle or adjusting plate positioned above the rotary chuck and extending in a radial direction of the chuck for substantially reducing the swirly flow of the solvent vapor created above the rotary chuck in the vessel when the chuck is rotated.

According to the construction of the resist coating apparatus described above, and particularly, the location of the adjusting plate, the swirly flow of the solvent vapor created in the sealed coating vessel is baffled to weaken or substantially reduce the swirly flow, whereby a substrate with a coated resist having even film thickness can be fabricated, thus improving the quality and the yield of the substrate.

Preferred embodiments of this invention will be described hereunder in detail with reference to the accompanying drawings.

BRIEF DESCRIPTION OF THE DRAWINGS

In the accompanying drawings

DETAILED DESCRIPTION OF THE INVENTION

For a better understanding of this invention, a conventional resist coating apparatus and problems or drawbacks encountered therewith will first be described hereunder with reference to FIGS. 1, 2, and 3 before a description of preferred embodiments of this invention.

Figure 1:
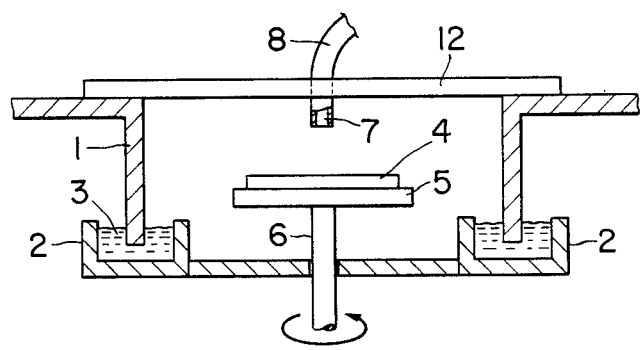
FIG. 1 is an elevation, in vertical section, of a resist coating apparatus of conventional type.

FIG. 1 shows one example of a conventional resist coating apparatus generally comprising a coating vessel 1, in which an annular trough or receptacle 2 of substantially channel-shaped cross section is disposed at the lower end of the side wall of the coating vessel 1 and contains an organic solvent 3 such as ethyl alcohol. The solvent 3 reaches at least the lower end of the coating vessel side wall to maintain a sealed condition in the coating vessel 1 and to create the solvent atmosphere therein. A rotary chuck 5 for supporting a substrate 4 thereon is disposed at the center of the interior of the coating vessel 1 and is supported by a vertical shaft 6 extending downwardly through the bottom of the coating vessel and coupled to driving means, not shown, for rotating the chuck 5, i.e., the substrate 4 disposed thereon at a specific rotational speed.

A tube 8 for supplying the liquid resist under pressure into the coating vessel 1 is connected at one end to a resist supply device, not shown, and at the other end thereof, the tube 8 extends into the coating vessel 1 through a cover 12 thereof. To the end of the tube 8 inserted into the coating vessel 1 is mounted a resist dropping nozzle 7 at a position substantially coaxial with the shaft 6.

With the resist coating apparatus of the character described above, the liquid state resist is dropped from the nozzle member 7 directly onto the central portion of the substrate 4 disposed on and fixed to the upper surface of the rotary chuck 5. When, under this condition, the substrate 4 is rotated by rotating the shaft 6 at a rotational speed of 400 rpm, for example, the liquid state resist is spread outwardly and evenly over the entire surface of the substrate 4 by the centrifugal force acting thereon.

Figure 2:
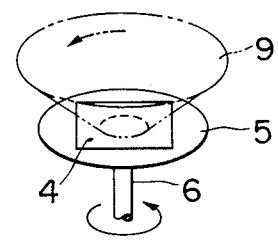
FIG. 2 is a perspective view explanatory of swirly flow of a solvent vapor created by the rotation of a rotary chuck disposed in the coating apparatus shown in FIG. 1.

However, according to this operation of the device shown in FIG. 1, as shown in FIG. 2, a swirly flow of the solvent vapor is caused in the coating vessel 1, and this swirly flow causes the pressure difference of the vapor described hereinbefore which will causes the resist to form a film having uneven thickness.

Figures 3A, 3B:
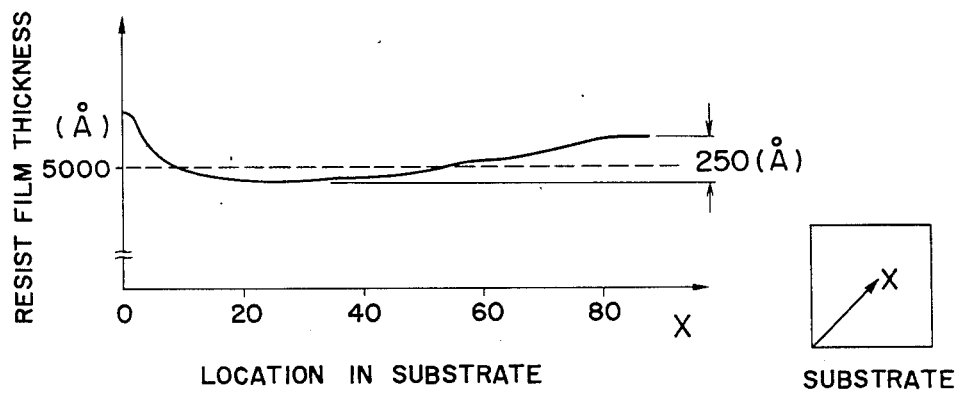
FIG. 3 is a graph indicating the relationship between location in a substrate and the thickness of a resist film applied as a coat on the substrate by using the conventional coating apparatus shown in FIG. 1.

For example, in a case where it is required to coat a mask substrate having a diameter of 5 inches with resist having viscosity of 50 cp, it is necessary to rotate the chuck with a rotational speed of 400 rpm for 200 seconds in order to form a resist film having a thickness of 5,000 Å on the substrate. However, according to this method, for example, when the film thickness of the resist on the substrate is measured at portions along the arrow direction shown in FIG. 3B, it was found as shown in FIG. 3A that the thicknesses of the coated resist film are different by about 250 Å at positions between the peripheral portion of the substrate and the central portion thereof because of the swirly flow of the solvent vapor.

Figure 4:
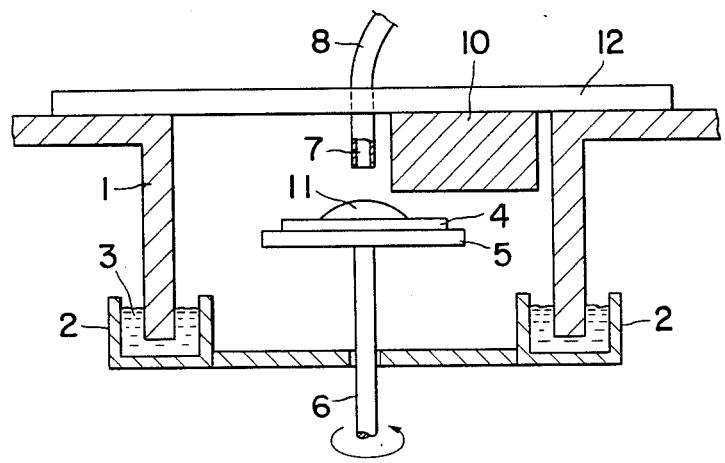
FIG. 4 is an elevation, in vertical section, of a resist coating apparatus constituting one embodiment of this invention.

This invention has succeeded in overcoming the above described problems encountered in the prior art by providing an improved resist coating apparatus, one example of which, as shown in FIG. 4, has substantially the same construction as that of the prior art apparatus shown in FIG. 1 except for a thin plate type adjusting member 10 disposed vertically in the coating vessel 1 at a position above the circular rotary chuck 5 so as to extend in the radial direction of the chuck 5. The adjusting plate 10 serves to effectively reduce the swirly flow of the solvent vapor caused by the high speed rotation of the chuck 5 on which the substrate 4 is mounted. It is necessary that the adjusting plate 10 have a lower edge substantially parallel to the upper surface of the chuck 5.

Figure 5:
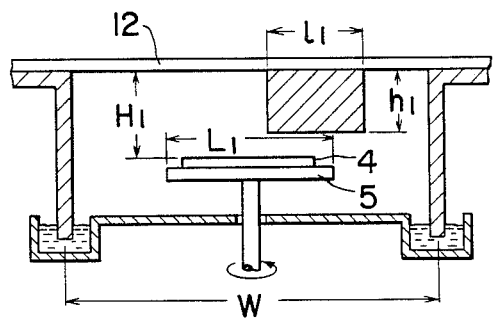
FIG. 5 is a view similar to that shown in FIG. 4 in which dimensions of pertinent elements of the coating apparatus are designated for determining the size of an adjusting plate to be located in the resist coating apparatus.

In order to obtain the most favorable shape or dimension of the adjusting plate, an experiment was carried out by using a coating apparatus having the following dimensions or sizes as shown in FIG. 5.

$L_1$: diameter of the rotary chuck 5,
$H_1$: distance between the upper surface of the substrate 4 mounted on the chuck 5 and the lower surface of the cover plate 12 of the coating vessel 1,
$h_1$: vertical height of the adjusting plate 10, and
$l_1$: horizontal length of the adjusting plate 10.

The experiment was performed by changing the ratios $R_1 = h_1/H_1$ and $R_2 = l_1/L_1$ under the condition that a positive type resist to be exposed to electron beams with a viscosity of 50 cp was dropped and applied as coating on a blank substrate having a diameter of 5 inches and the substrate was rotated at a rotational speed of 400 rpm for 200 seconds.

Figure 6A:
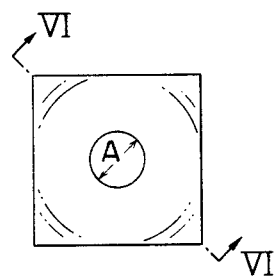
FIG. 6A is a plan view of a resist film indicating the area of a part thereof of a film thickness differing by a specific value from the average film thickness.
Figure 6B:
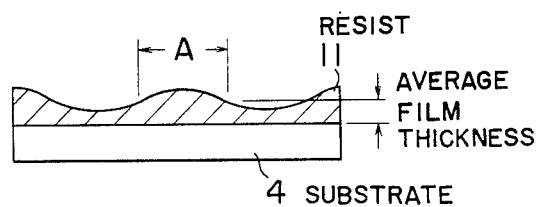
FIG. 6B is a sectional view taken along the line VI—VI shown in FIG. 6A.
Figure 7:
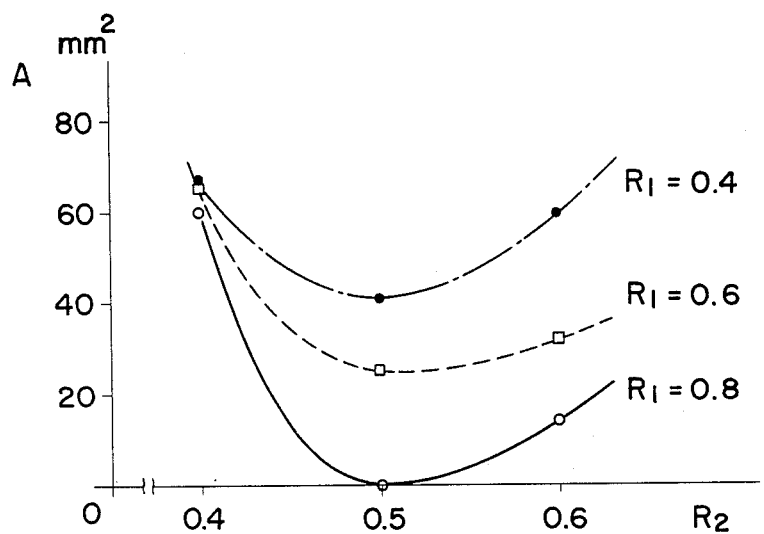
FIG. 7 is a graph indicating the results of a resist coating experiment conducted by using the resist coating apparatus shown in FIG. 5 for determining the size of the adjusting plate.

The results of the experiment are indicated by the graph shown in FIG. 7, which shows the relationship, with the ratio $R_1$ as a parameter, between the ratio $R_2$ and the area A of a portion having a difference in the resist film thickness of more than 15 Å from the average resist film thickness as shown in FIGS. 6A and 6B.

From FIG. 7, it will be seen that the most favorable result is obtained in the case where the ratio $R_1$ approaches nearly 1 ($R_1 \div 1$), that is; the lower edge of the adjusting plate approaches as closely as possible the upper surface of the substrate, and, otherwise, in the case where the ratio $R_2$ approaches nearly 0.5 ($R_2 \div 0.5$), that is, the horizontal length $l_1$ of the adjusting plate is equal to the radius $L_1/2$ of the rotary chuck. These results were supported by observation of the swirly flow of $CO_2$ gas evaporated from dry ice used instead of the solvent.

As described hereinbefore, according to the first embodiment of this invention, the swirly flow of the solvent atmosphere caused by the rotation of the chuck 5 in the resist coating vessel 1 can be effectively reduced by providing the adjusting plate 10, whereby the vapour pressure in the coating vessel 1 is maintained substantially uniform, and, accordingly, the resist 11 can be uniformly coated on the entire surface of the substrate 4. A pattern can thus be formed on the substrate 4 with uniform dimension and the quality and yield of the substrate can be remarkably improved.

Figure 8A:
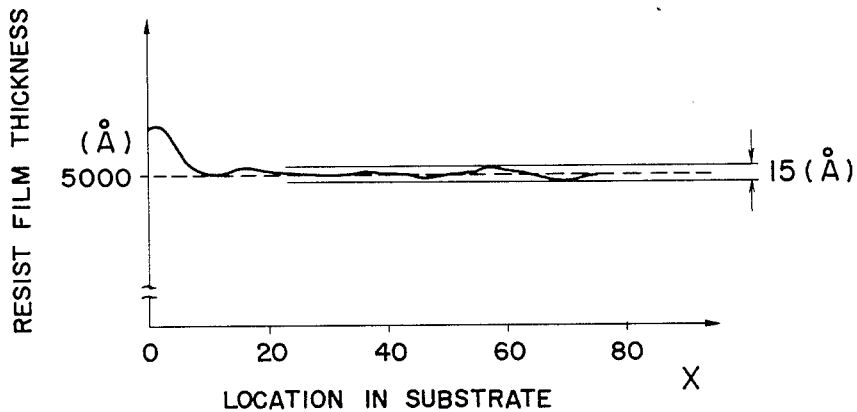
FIG. 8 is a graph similar to that of FIG. 3, but according to this invention for showing the evenness of the coated resist film thickness.
Figure 8B:
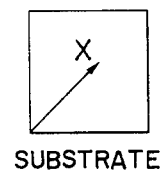

FIG. 8A shows a result of an experiment performed for forming a resist having a film thickness of 5,000 Å and a viscosity of 50 cp on a blank substrate having a diameter of 5 inches by using the coating apparatus of this example with the rotary chuck rotating at a rotational speed of 400 rpm for 200 seconds, the film thickness being measured along the arrow direction in FIG. 8B. According to the result of this experiment shown in FIG. 8A, it is found that the difference in the resist film thickness at positions between the peripheral portion and the central portion of the substrate is merely approximately 15 Å.

In the above described example, the adjusting plate 10 may be arranged so as to be stationarily suspended from the lower surface of the cover plate 12 of the coating vessel 1, but in a preferred modification, the adjusting plate 10 of rectangular or other shape is arranged to be movable in association with a moving mechanism, not shown. The plate 10 may also be supported in an inclined manner with respect to the rotary chuck 5 at a position where it will not disturb the dropping of the liquid state resist from the nozzle member 7. A plurality of adjusting plates 10 of the character described above may be used in a preferred modification.

Figure 9:
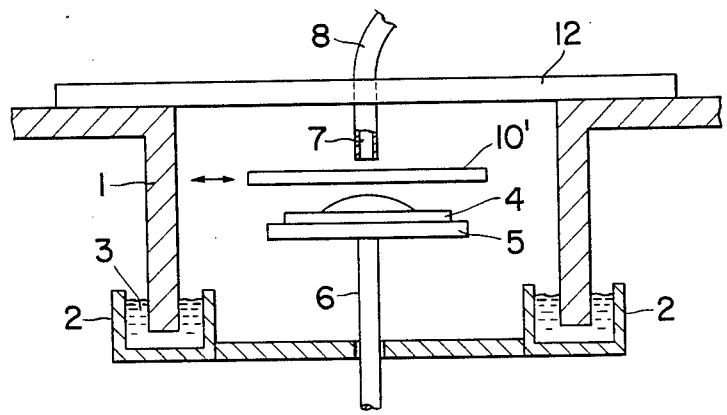
FIG. 9 is an elevation, in vertical section, of a resist coating apparatus constituting another embodiment of this invention.

FIG. 9 shows another embodiment of the resist coating apparatus according to this invention wherein like reference numerals are used for members or elements corresponding to those shown in FIG. 4. Detailed descriptions relating to such members and elements will not be repeated.

In this second embodiment of the invention, an adjusting plate 10' is substituted for the adjusting plate 10 of the first embodiment. This adjusting plate 10' comprises a disc disposed above and parallelly to the rotary chuck 5 in the coating vessel 1.

The disc shaped adjusting plate 10' is retracted to the peripheral portion by a disc moving mechanism when the liquid resist is dropped on the substrate 4 from the nozzle member 7 positioned directly above the same and after the resist has been dropped, the disc 10' is moved to its position above the rotary chuck 5.

Figure 10:
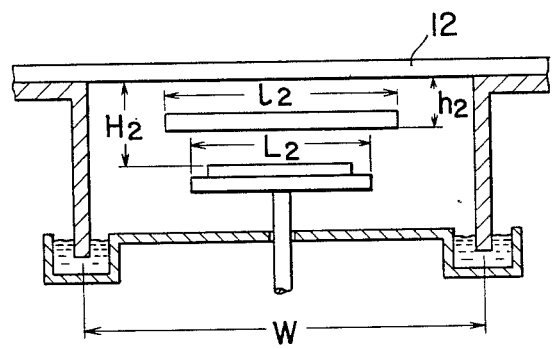
FIG. 10 is a view similar to that shown in FIG. 9 in which dimensions of pertinent elements of the coating apparatus are added for determining the size of an adjusting disc plate to be located in the apparatus.

In order to determine the most favorable dimension of the disc plate 10', an experiment was carried out by using a coating apparatus having the following dimensions or sizes as shown in FIG. 10.

$L_2$: diameter of the rotary chuck 5, $H_2$: distance between the upper surface of the substrate 4 mounted on the chuck 5 and the lower surface of the cover plate 12 of the coating vessel 1, $l_2$: diameter of the adjusting disc plate 10', and $h_2$: distance between the lower surface of the disc plate 10' and the lower surface of the cover plate 12.

Under the provision of the relationships $R_3 = h_2/H_2$, $R_4 = l_2/L_2$ and $R_4 \geq 1$, the dimension of the adjusting disc plate 10' is determined by considering the relationship between the ratio $R_3$ and the area A at which the difference in the resist film thickness occurs.

Figure 11:
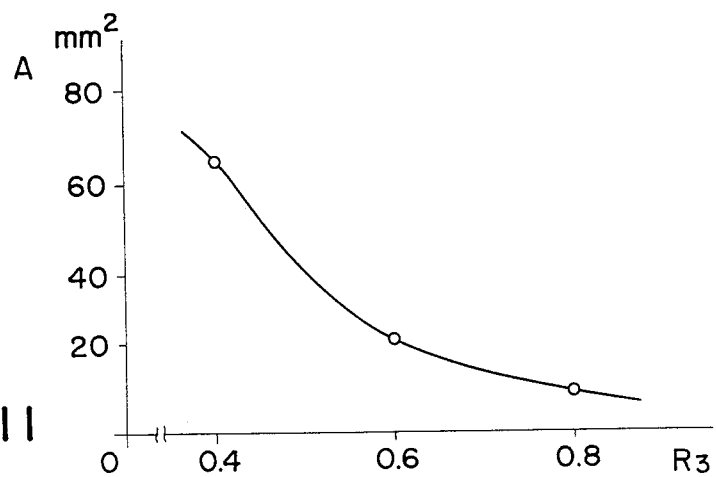
FIG. 11 is a graph, similar to that shown in FIG. 7, obtained by using the resist coating apparatus shown in FIG. 9.

FIG. 11 is a graph representing the result of this experiment, which indicates the fact that the difference in the film thickness of the resist coating on the substrate is gradually eliminated or reduced as the ratio $R_3$ approaches the value "1", that is, the lower surface of the adjusting disc plate approaches the rotary chuck.

As described hereinabove, according to the preferred embodiments of resist coating apparatus of this invention, an adjusting plate is located above the rotary chuck supporting the substrate thereon in a resist coating vessel when the chuck is rotated to substantially reduce swirly flow of solvent vapour in the coating vessel, so that the vapour pressure of the solvent atmosphere in the coating vessel is made uniform, thus forming a resist having substantially an even film thickness on the substrate. Accordingly, a pattern having a uniform dimension can be formed on the substrate and the quality and the yield of the substrate can be remarkably improved.

What is claimed is:

1. An apparatus for coating resist on a substrate comprising:
    a vessel having an open top covered by a cover plate;
    sealing means for creating a sealed solvent vapor atmosphere in said vessel;
    a circular rotary chuck disposed in said vessel at substantially the central portion thereof, said chuck with the substrate supported thereon being rotatable about a vertical axis by driving means;
    means disposed directly above said rotary chuck and adapted to drop liquid state resist on said substrate thereby to form a resist coat thereon; and
    means disposed above said rotary chuck and extending in a radial direction thereof for substantially reducing swirly flow of the solvent vapour created above said rotary chuck when said rotary chuck is rotated.

2. The apparatus according to claim 1 wherein said swirly flow eliminating means is a vertically orientated adjusting plate having a lower edge parallel to the surface of said rotary chuck.

3. The apparatus according to claim 2 wherein said adjusting plate is of a rectangular plate having an upper edge stationarily secured to the lower surface of the cover plate of said vessel at a position apart from and clear of the path of the resist thus dropped.

4. The apparatus according to claim 2 wherein said adjusting plate is movably supported by a moving member so that said adjusting plate is positioned above said rotary chuck when said rotary chuck is rotated.

5. The apparatus according to claim 3 wherein said adjusting plate is disposed so as to have an inclination with respect to said chuck.

6. The apparatus according to claim 5 wherein said inclination is a right angle.

7. The apparatus according to claim 6 wherein a radial length of the lower edge of said rectangular adjusting plate is substantially equal to the radius of said circular rotary chuck.

8. The apparatus according to claim 2 wherein said adjusting plate is a flat disc plate parallelly disposed above and near the upper surface of said chuck.

9. The apparatus according to claim 8 wherein said adjusting disc plate is movable and supported by a moving member at a position apart from the lower end of said resist dropping means when the resist is dropped on the substrate.

10. The apparatus according to claim 1 wherein said resist dropping means is a nozzle member disposed directly above the central portion of said rotary chuck and extending downward through the cover of said vessel.

* * * * *